US012701726B2

(12) United States Patent
Jin

(10) Patent No.: US 12,701,726 B2
(45) Date of Patent: Aug. 4, 2026

(54) SEMICONDUCTOR STRUCTURE AND METHOD FOR FORMING SAME

(71) Applicant: Semiconductor Manufacturing International (Shanghai) Corporation, Shanghai (CN)

(72) Inventor: Jisong Jin, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 383 days.

(21) Appl. No.: 18/096,101

(22) Filed: Jan. 12, 2023

(65) Prior Publication Data

US 2023/0411444 A1 Dec. 21, 2023

(30) Foreign Application Priority Data

May 18, 2022 (CN) .......................... 202210543130.4

(51) Int. Cl.
| | |
|---|---|
| *H10D 1/68* | (2025.01) |
| *H10B 12/00* | (2023.01) |
| *H10D 1/00* | (2025.01) |
| *H10W 20/41* | (2026.01) |

(52) U.S. Cl.
CPC ............. *H10D 1/696* (2025.01); *H10D 1/042* (2025.01); *H10D 1/684* (2025.01); *H10D 1/714* (2025.01); *H10D 1/716* (2025.01); *H10W 20/435* (2026.01)

(58) Field of Classification Search
CPC . H01L 23/5223; H01L 23/5283; H10D 1/042; H10D 1/684; H10D 1/696; H10D 1/714; H10D 1/68; H10D 1/692; H10D 1/716; H10B 12/00; H10W 20/435
See application file for complete search history.

(56) References Cited

U.S. PATENT DOCUMENTS

| | | | | |
|---|---|---|---|---|
| 2020/0098518 A1* | 3/2020 | Lee | .......................... | H01G 4/10 |
| 2021/0083041 A1* | 3/2021 | Wu | .......................... | H10D 1/68 |
| 2021/0098564 A1* | 4/2021 | Yin | ........................ | H10D 1/684 |
| 2022/0384563 A1* | 12/2022 | Kim | ........................ | H10D 1/694 |

* cited by examiner

*Primary Examiner* — Omar F Mojaddedi
(74) *Attorney, Agent, or Firm* — Crowell & Moring LLP

(57) ABSTRACT

A semiconductor structure and a method for forming same are provided. The forming method includes: forming a second electrode layer on a first dielectric layer, where the second electrode layer covers the first dielectric layer in a first region; forming a second dielectric layer on a second electrode layer and in a second region; forming a third electrode layer on the second dielectric layer, where on a projection plane parallel to the base, the third electrode layer has an overlapping region with each of the first region and the second region; and forming a first electrically connecting structure in contact with the second electrode layer, and forming, in the second region, a second electrically connecting structure in contact with the third electrode layer and the first electrode layer; or forming a third electrically connecting structure in contact with the first electrode layer, and forming a fourth electrically connecting structure in contact with the second electrode layer and the third electrode layer. By adjusting a connection relationship between different electrode layers, different equivalent capacitance densities can be obtained, thereby satisfying demands of different types of capacitors.

16 Claims, 4 Drawing Sheets

SEMICONDUCTOR STRUCTURE AND METHOD FOR FORMING SAME

RELATED APPLICATIONS

The present application claims priority to Chinese Patent Appln. No. 202210543130.4, filed May 18, 2022, the entire disclosure of which is hereby incorporated by reference.

TECHNICAL FIELD

Embodiments and implementations of the present disclosure relate to the field of semiconductor manufacturing, and in particular, to a semiconductor structure and a method for forming same.

BACKGROUND

The semiconductor integrated circuit (IC) industry is growing rapidly. The IC industry has produced generations of integrated circuits with technological advances in materials and design. Each generation of circuit is smaller and more complex than a previous generation of circuit. However, these advances increase the complexity of processing and manufacturing an IC, and in order to achieve these advances, similar developments are required in processing and manufacturing of ICs. In the development of ICs, a functional density (that is, a number of interconnected devices per chip area) is gradually increased while a geometric dimension (that is, a smallest component that can be manufactured by using a manufacturing process) is gradually reduced.

A metal insulator metal (MIM) capacitor is usually used in mixed-signal devices and logic devices (such as embedded memories and radio frequency devices). The MIM capacitor is usually configured to store charges in various semiconductor devices. In order to satisfy performance requirements of a device, a capacitance density of the MIM capacitor is also gradually increased.

However, an equivalent capacitance density of an MIM capacitor still needs to be improved, and only a single equivalent capacitance density option is provided.

SUMMARY

A problem to be addressed in embodiments and implementations of the present disclosure is to provide semiconductor structures and methods for forming the same, so as to obtain different equivalent capacitance densities, thereby satisfying demands of different types of capacitors.

To address the above-described technical problem, one form of the present disclosure provides a semiconductor structure, including: a base; a first electrode layer, arranged on the base and including a first region and a second region; a first dielectric layer, arranged on a top and a sidewall of the first electrode layer; a second electrode layer, covering the first dielectric layer in the first region; a second dielectric layer, arranged on the second electrode layer and the second region; a third electrode layer, arranged on the second dielectric layer, where on a projection plane parallel to the base, the third electrode layer has an overlapping region with each of the first region and the second region; and a first electrically connecting structure set, including: a first electrically connecting structure, in contact with the second electrode layer; and a second electrically connecting structure, arranged in the second region and in contact with the third electrode layer and the first electrode layer; or a second electrically connecting structure set, including: a third electrically connecting structure, in contact with the first electrode layer; and a fourth electrically connecting structure, in contact with the second electrode layer and the third electrode layer.

Another form of the present disclosure provides a method for forming a semiconductor structure, including: providing a base; forming a first electrode layer on the base, where the first electrode layer includes a first region and a second region; forming a first dielectric layer on a top and a sidewall of the first electrode layer; forming a second electrode layer on the first dielectric layer, where the second electrode layer covers the first dielectric layer in the first region; forming a second dielectric layer on the second electrode layer and in the second region; forming a third electrode layer on the second dielectric layer, where on a projection plane parallel to the base, the third electrode layer has an overlapping region with each of the first region and the second region; and forming a first electrically connecting structure in contact with the second electrode layer, and forming, in the second region, a second electrically connecting structure in contact with the third electrode layer and the first electrode layer; or forming a third electrically connecting structure in contact with the first electrode layer, and forming a fourth electrically connecting structure in contact with the second electrode layer and the third electrode layer.

Compared with the prior art, technical solutions of embodiments and implementations of the present disclosure have at least the following advantages.

In forms of a semiconductor structure provided in embodiments and implementations of the present disclosure, on the projection plane parallel to the base, the third electrode layer has an overlapping region with each of the first region and the second region. That is to say, the third electrode layer is arranged opposite to the second electrode layer and the first electrode layer. Since the first electrically connecting structure set is arranged, which includes the first electrically connecting structure in contact with the second electrode layer and the second electrically connecting structure arranged in the second region and in contact with the third electrode layer and the first electrode layer. Therefore, a capacitor is formed between the first electrode layer and the second electrode layer and between the second electrode layer and the third electrode layer, which helps improve an equivalent capacitance density. Alternatively, since the second electrically connecting structure set is arranged, which includes the third electrically connecting structure in contact with the first electrode layer and the fourth electrically connecting structure in contact with the second electrode layer and the third electrode layer, a capacitor is formed between the first electrode layer and the second electrode layer and between the first electrode layer and the third electrode layer. Therefore, embodiments and implementations of the present disclosure help provide options for obtaining different equivalent capacitance densities to satisfy demands of different types of capacitors.

In forms of a method for forming a semiconductor structure provided in embodiments and implementations of the present disclosure, the third electrode layer is formed on the second dielectric layer, and on the projection plane parallel to the base, the third electrode layer has an overlapping region with each of the first region and the second region. That is to say, the third electrode layer is arranged opposite to the second electrode layer and the first electrode layer. Since the first electrically connecting structure in contact with the second electrode layer is formed, and the second electrically connecting structure in contact with the third electrode layer and the first electrode layer is formed in the second region, a capacitor is formed between the first electrode layer and the second electrode layer and between the second electrode layer and the third electrode layer, which helps improve an equivalent capacitance density. Alternatively, since the third electrically connecting structure in contact with first electrode layer is formed, and the fourth electrically connecting structure in contact with the second electrode layer and the third electrode layer is formed, a capacitor is formed between the first electrode layer and the second electrode layer and between the first electrode layer and the third electrode layer. Therefore, embodiments and implementations of the present disclosure help provide options for obtaining different equivalent capacitance densities to satisfy demands of different types of capacitors.

DETAILED DESCRIPTION

It can be learned from the background that an equivalent capacitance density of a current metal insulator metal (MIM) capacitor still needs to be improved, and only a single equivalent capacitance density option is provided. Specifically, s structure of a traditional MIM capacitor includes a bottom electrode layer, a dielectric layer, and a top electrode layer stacked in sequence from bottom to top. The MIM capacitor includes only a single dielectric layer, and the bottom electrode layer and the single top electrode layer are arranged oppositely to form a capacitor. An equivalent capacitance density is relatively small.

In order to address the above-described technical problem, one form of the present disclosure provides a semiconductor structure. On a projection plane parallel to a base, a third electrode layer has an overlapping region with each of a first region and a second region. That is to say, the third electrode layer is arranged opposite to the second electrode layer and the first electrode layer. Since a first electrically connecting structure set is formed, a capacitor is formed between the first electrode layer and the second electrode layer and between the second electrode layer and the third electrode layer, which helps improve an equivalent capacitance density. Alternatively, since a second electrically connecting structure set is formed, a capacitor is formed between the first electrode layer and the second electrode layer and between the first electrode layer and the third electrode layer. Therefore, this form of the present disclosure helps provide options for obtaining different equivalent capacitance densities to satisfy demands of different types of capacitors.

Figure 1:
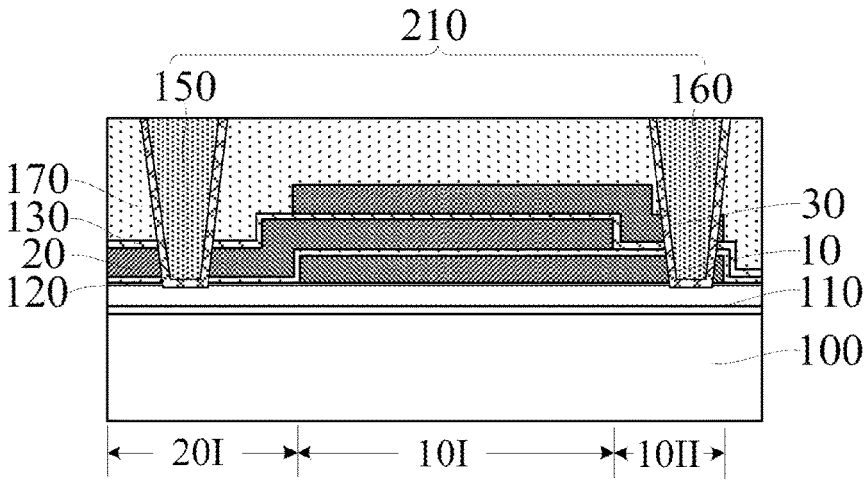
FIG. 1 and FIG. 2 are schematic structural diagrams of one form of a semiconductor structure according to the present disclosure.
Figure 2:
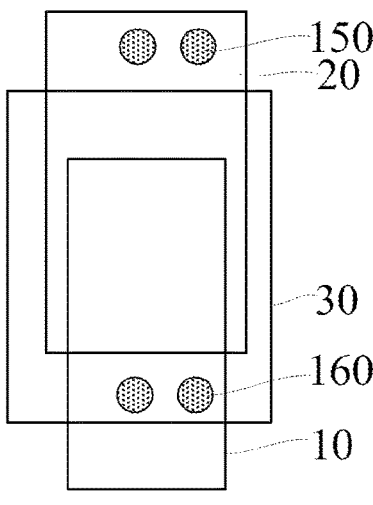

To make the foregoing objectives, features, and advantages of embodiments and implementations of the present disclosure more apparent and easier to understand, specific embodiments and implementations of the present disclosure are described in detail below with reference to the accompanying drawings. FIG. 1 and FIG. 2 are schematic structural diagrams of one form of a semiconductor structure according to the present disclosure. FIG. 1 is a cross-sectional view, and FIG. 2 is a top view corresponding to FIG. 1.

As shown in FIG. 1 and FIG. 2, in this form, the semiconductor structure includes: a base 100; a first electrode layer 10, arranged on the base 100 and including a first region 10I and a second region 10II; a first dielectric layer 120, arranged on a top and a sidewall of the first electrode layer 10; a second electrode layer 20, covering the first dielectric layer 120 in the first region 10I; a second dielectric layer 130, arranged on the second electrode layer 20 and the second region 10II; a third electrode layer 30, arranged on the second dielectric layer 130, where on a projection plane parallel to the base 100, the third electrode layer 30 has an overlapping region with each of the first region 10I and the second region 10II; and a first electrically connecting structure set, including: a first electrically connecting structure 150, in contact with the second electrode layer 20; and a second electrically connecting structure 160, arranged in the second region 10II and in contact with the third electrode layer 30 and the first electrode layer 10; or a second electrically connecting structure set, including: a third electrically connecting structure, in contact with the first electrode layer; and a fourth electrically connecting structure, in contact with the second electrode layer and the third electrode layer.

In some implementations, a first electrical construction structure set 210 is arranged in the semiconductor structure, for example.

The base 100 is configured to provide a process platform for subsequent formation of an MIM capacitor. In some implementations, the base 100 includes a substrate (not shown), and the substrate is a silicon substrate. In other implementations, the substrate may be made of other materials such as germanium, silicon germanium, silicon carbide, gallium arsenide, or indium gallium, and the substrate may be other types of substrates such as a silicon substrate on an insulator or a germanium substrate on an insulator.

In some implementations, the MIM capacitor is formed in a back-end process. Therefore, an inter-metal dielectric (IMD) layer (not shown) is further formed on the base 100. According to a status of the process, one or more stacked metal layers, such as a first metal (that is, M1) layer and a second metal (that is, M2) layer are formed in the inter-metal dielectric layer along a normal direction of a surface of the base. When a plurality of metal layers is arranged, two adjacent metal layers are electrically connected by a via interconnecting structure located therebetween.

In some implementations, the semiconductor structure further includes an etching stop layer 110 arranged between the base 100 and the first electrode layer 10 and between the base 100 and the first dielectric layer 120.

The etching stop layer 110 is configured to define a position where the etching stops during formation of the first electrode layer 10, the first electrically connecting structure set 210, or the second electrically connecting structure set, so as to reduce a probability of causing damage to the base 100, which helps improve bottom height consistency of the first electrically connecting structure set 210 and bottom height consistency of the second electrically connecting structure set.

In an example, a material of the etching stop layer 110 is silicon nitride. In other implementations, the etching stop layer may be made of other materials with a relatively high etch selectivity to a material of the base, such as one or more of silicon nitride, aluminum oxide, aluminum nitride, or carbon-doped silicon nitride.

The first electrode layer 10 is used as an electrode plate of the MIM capacitor. Specifically, the first electrode layer 10 is arranged on the etching stop layer 110.

A material of the first electrode layer 10 is a conductive material. In an example, the material of the first electrode layer 10 includes one or more of W, Cu, Co, TiN, Ti, Ta, TaN, Ru, RuN, or AL.

The first dielectric layer 120 is used as an insulating layer in the formed MIM capacitor, to isolate the first electrode layer 10 from the subsequent second electrode layer. Specifically, the first dielectric layer 120 conformally covers the first electrode layer 10 and the base 100.

In some implementations, the material of the first dielectric layer 120 is a high-k dielectric material. The high-k dielectric material is a dielectric material having a relative dielectric constant greater than a relative dielectric constant of silicon oxide. Using the high-k dielectric material can help increase a capacitance value of the MIM capacitor, thereby improving a capacitance density.

Specifically, the first dielectric layer 120 is a high-k dielectric layer formed by stacking, that is, the first dielectric layer 120 is a high-k composite dielectric layer. After a thickness of the high-k dielectric layer reaches a set value, quality of the high-k dielectric layer tends to deteriorate. By using the high-k composite dielectric layer, the thickness of the first dielectric layer 120 can satisfy process requirements, and relative desirable quality can be realized. The high-k dielectric material includes one or more of $HfO_2$, $HfSiO$, $TiO_2$, $HfZrO$, $HfSiON$, $HfTaO$, $HfTiO$, $Ta_2O_5$, $ZrO_2$, $ZrSiO_2$, $Al_2O_3$, $SrTiO_3$, $BaSrTiO$, or $SiN$.

In some implementations, the first dielectric layer 120 is a ZAZ layer. The ZAZ layer includes a first $ZrO_2$ layer, an $Al_2O_3$ layer, and a second $ZrO_2$ layer formed by stacking. In other implementations, according to process requirements, the material of the first dielectric layer may be one or more of silicon oxide, silicon oxynitride, or silicon nitride.

The second electrode layer 20 is used as an electrode plate of the MIM capacitor.

The second electrode layer 20 covers the first dielectric layer 120 in the first region so that the second electrode layer 20 is arranged opposite to the first region 10I. Therefore, the second electrode layer 20 can form an MIM capacitor with the first electrode layer 10 in the first region 10I.

In some implementations, the second region 10II is exposed from the second electrode layer 20, so that the third electrode layer 30 can cover the second region 10II, which helps the second electrically connecting structure 160 extend through the third electrode layer in the second region 10II, and the second electrically connecting structure 160 can come into contact with the first electrode layer 10, thereby realizing electrical connection between the first electrode layer 10 and the third electrode layer 30.

It should be noted that, in some implementations, the second electrode layer 20 includes a connection region 20I for electrical connection. In some implementations, the connection region 20I is arranged on a side of the first electrode layer 10. The connection region 20I is configured to form an electrically connecting structure for electrically connecting the second electrode layer 20 to the outside.

A material of the second electrode layer 20 is a conductive material. In an example, the material of the second electrode layer 20 includes one or more of W, Cu, Co, TiN, Ti, Ta, TaN, Ru, RuN, or AL.

The second dielectric layer 130 is used as an insulating layer of the MIM capacitor, to isolate the second electrode layer 20 from the third electrode layer 30. In some implementations, the second dielectric layer 130 conformally covers the second electrode layer and the second region 10II.

In some implementations, the material of the second dielectric layer 130 is a high-k dielectric material. The high-k dielectric material is a dielectric material having a relative dielectric constant greater than a relative dielectric constant of silicon oxide. Using the high-k dielectric material can help increase a capacitance value of the MIM capacitor, thereby improving a capacitance density.

Specifically, the second dielectric layer 130 is a high-k dielectric layer formed by stacking, that is, the second dielectric layer 130 is a high-k composite dielectric layer. After a thickness of the high-k dielectric layer reaches a set value, quality of the high-k dielectric layer tends to deteriorate. By using the high-k composite dielectric layer, the thickness of the second dielectric layer 130 can satisfy process requirements, and relative desirable quality can be realized. The high-k dielectric material includes any one or more of $HfO_2$, $HfSiO$, $TiO_2$, $HfZrO$, $HfSiON$, $HfTaO$, $HfTiO$, $Ta_2O_5$, $ZrO_2$, $ZrSiO_2$, $Al_2O_3$, $SrTiO_3$, $BaSrTiO$, or $SiN$.

The material of the second dielectric layer 130 may be the same as or different from the material of the first dielectric layer 120.

In some implementations, the second dielectric layer 130 is a ZAZ layer. The ZAZ layer includes a first $ZrO_2$ layer, an $Al_2O_3$ layer, and a second $ZrO_2$ layer formed by stacking. In other implementations, according to process requirements, the material of the second dielectric layer may be one or more of silicon oxide, silicon oxynitride, or silicon nitride.

The third electrode layer 30 is used as an electrode plate of the MIM capacitor.

On the projection plane parallel to the base 100, the third electrode layer 30 has an overlapping region with each of the first region 10I and the second region 10II. That is to say, the third electrode layer 30 is arranged opposite to the second electrode layer 20 and the first electrode layer 10. Since the first electrically connecting structure set 210 is arranged, which includes the first electrically connecting structure 150 in contact with the second electrode layer 20 and the second electrically connecting structure 160 arranged in the second region 10II and in contact with the third electrode layer 30 and the first electrode layer 10, a capacitor is formed between the first electrode layer 10 and the second electrode layer 20 and between the second electrode layer 20 and the third electrode layer 30, which helps improve an equivalent capacitance density. Alternatively, since the second electrically connecting structure set is arranged, which includes the third electrically connecting structure in contact with the first electrode layer and the fourth electrically connecting structure in contact with the second electrode layer and the third electrode layer, a capacitor is formed between the first electrode layer 10 and the second electrode layer 20 and between the first electrode layer 10 and the third electrode layer 30. Therefore, different equivalent capacitance densities can be obtained, thereby satisfying demands of different types of capacitors.

In some implementations, for example, the first electrically connecting structure set 210 is arranged in the semiconductor structure so that a capacitor is formed between the first electrode layer 10 and the second electrode layer 20 and between the second electrode layer 20 and the third electrode layer 30, which helps improve the equivalent capacitance density.

Correspondingly, the third electrode layer 30 and the second region 10II have an overlapping region, which helps form, in the second region 100II, the second electrically connecting structure 160 extending through the third electrode layer 30 and in contact with the first electrode layer 10, thereby realizing electrical connection between the third electrode layer and the first electrode layer 10.

It should be noted that, the connection region 20I is exposed from the third electrode layer 30, which helps form, in the connection region 20I, the first electrically connecting structure 150 in contact with the second electrode layer 20, thereby realizing electrical connection between the second electrode layer 20 and the external circuit.

A material of the third electrode layer 30 is a conductive material. In an example, the material of the third electrode layer 30 includes one or more of W, Cu, Co, TiN, Ti, Ta, TaN, Ru, RuN, or AL.

The first electrically connecting structure set 210 is configured to electrically connect the MIM capacitor to an external circuit.

In some implementations, since a capacitor is formed between the first electrode layer 10 and the second electrode layer 20 and between the second electrode layer 20 and the third electrode layer 30, and the first electrode layer 10 and the third electrode layer 30 are connected to a same potential by the second electrically connecting structure 160, so that the two formed capacitors are connected in parallel, thereby increasing a capacitance value per unit area, that is, increasing the equivalent capacitance density.

The first electrically connecting structure 150 is configured to electrically connect the second electrode layer 20 to an external circuit. Specifically, in some implementations, the first electrically connecting structure 150 is arranged in the connection region 20I and is in contact with the second electrode layer 20.

In some implementations, the second electrode layer 20 in the connection region 20I covers the first dielectric layer 120 on the base 100. Since the first electrically connecting structure 150 extends through the second electrode layer 20 in the connection region 20I, and a bottom of the first electrically connecting structure 150 is in contact with a top surface of the etching stop layer 110, the bottom of the first electrically connecting structure 150 can stop on the etching stop layer 110, which helps improve the bottom height consistency of the first electrically connecting structure 150.

A material of the first electrically connecting structure 150 is a conductive material. In some implementations, the material of the first electrically connecting structure 150 includes one or more of W, Cu, Co, TiN, Ti, Ta, TaN, Ru, RuN, or Al.

The second electrically connecting structure 160 is configured to electrically connect the first electrode layer 10 to the third electrode layer 30, and is further configured to electrically connect the first electrode layer 10 and the third electrode layer 30 to the external circuit. Therefore, when the capacitor works, the first electrode layer 10 and the third electrode layer 30 can be connected to the same potential.

Specifically, in some implementations, the second electrically connecting structure 160 extends through the first dielectric layer 120, the second dielectric layer 130, and the third electrode layer 30 in the second region 10II, and is in contact with the first electrode layer 10, so that the second electrically connecting structure 160 electrically connects the first electrode layer 10 to the third electrode layer 30.

In some implementations, the second electrically connecting structure 160 extends through the first electrode layer 10, and a bottom of the second electrically connecting structure 160 is in contact with the top surface of the etching stop layer 110, thereby improving the bottom height consistency of the second electrically connecting structure 160.

A material of the second electrically connecting structure 160 is a conductive material. In some implementations, the material of the second electrically connecting structure 160 includes one or more of W, Cu, Co, TiN, Ti, Ta, TaN, Ru, RuN, or AL.

It should be noted that, in some implementations, the semiconductor structure further includes a dielectric layer 170 arranged on the base 100 and covering the third electrode layer 30 and the second dielectric layer 130.

The dielectric layer 170 is configured to isolate the electrically connecting structures. A material of the dielectric layer 170 is a dielectric material. In an example, the material of the dielectric layer 170 is silicon oxide.

It should be further noted that, in some implementations, the semiconductor structure includes three electrode layers that are stacked, for example. In other implementations, another electrode layer may be further stacked on the third electrode layer.

For example, in other implementations, the semiconductor structure further includes: one or more fourth electrode layers, arranged on the third electrode layer, where on the projection plane parallel to the base, an odd-numbered fourth electrode layer covers the first region and the connection region and the second region is exposed from the odd-numbered fourth electrode layer, and an even-numbered fourth electrode layer has an overlapping region with each of the first region and the second region; and a fourth dielectric layer, arranged between the fourth electrode layer and the third electrode layer and between adjacent fourth electrode layers;

The first electrically connecting structure extends through the odd-numbered fourth electrode layer in the connection region, and is in contact with the second electrode layer, so that the first electrically connecting structure electrically connects the second electrode layer to the odd-numbered fourth electrode layer.

The second electrically connecting structure extends through the even-numbered fourth electrode layer in the second region, and is in contact with the first electrode layer, so that the second electrically connecting structure electrically connects the first electrode layer to the even-numbered fourth electrode layer.

Correspondingly, an MIM capacitor is formed between each two adjacent electrode layers, and the plurality of MIM capacitors are connected in parallel, which helps further improve the equivalent capacitance density.

It should be noted that, in some implementations, the odd-numbered layer and the even-numbered layer are numbers of layers corresponding to the fourth electrode layers along a direction from the base to the first electrode layer. For example, a fourth electrode layer closest to the third electrode layer is a first fourth electrode layer, and a fourth electrode layer adjacent to the first layer electrode layer is a second fourth electrode layer. Correspondingly, the first fourth electrode layer is an odd-numbered fourth electrode layer, and the second fourth electrode layer is an even-numbered electrode layer, and so on.

In some implementations, the second electrode layer in the connection region covers the first electrode layer on the base, the first electrically connecting structure extends through the second electrode layer in the connection region, and the second electrically connecting structure extends through the first electrode layer in the second region.

For the detailed description of the fourth electrode layer and the fourth dielectric layer, refer to the corresponding description of the first electrode layer and the first dielectric layer in the above-described embodiments and implementations. The details are not described herein.

Figure 3:
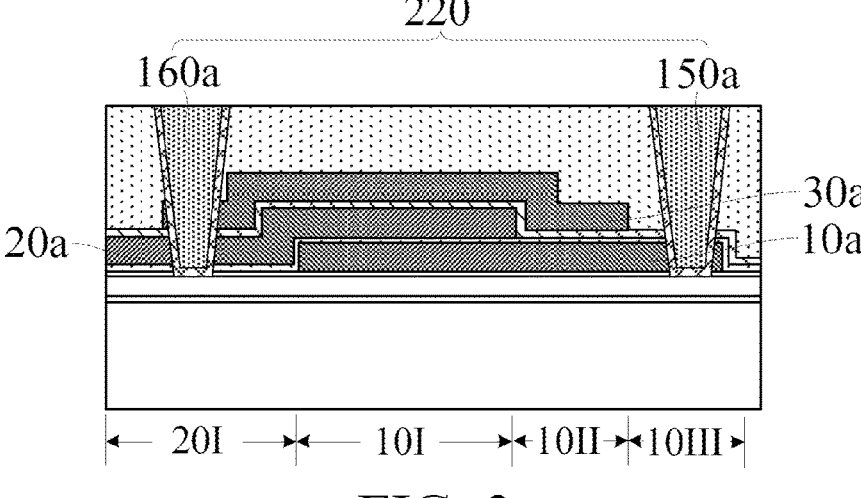
FIG. 3 and FIG. 4 are schematic structural diagrams of another form of a semiconductor structure according to the present disclosure.
Figures 4, 5, 6, 7, 8:
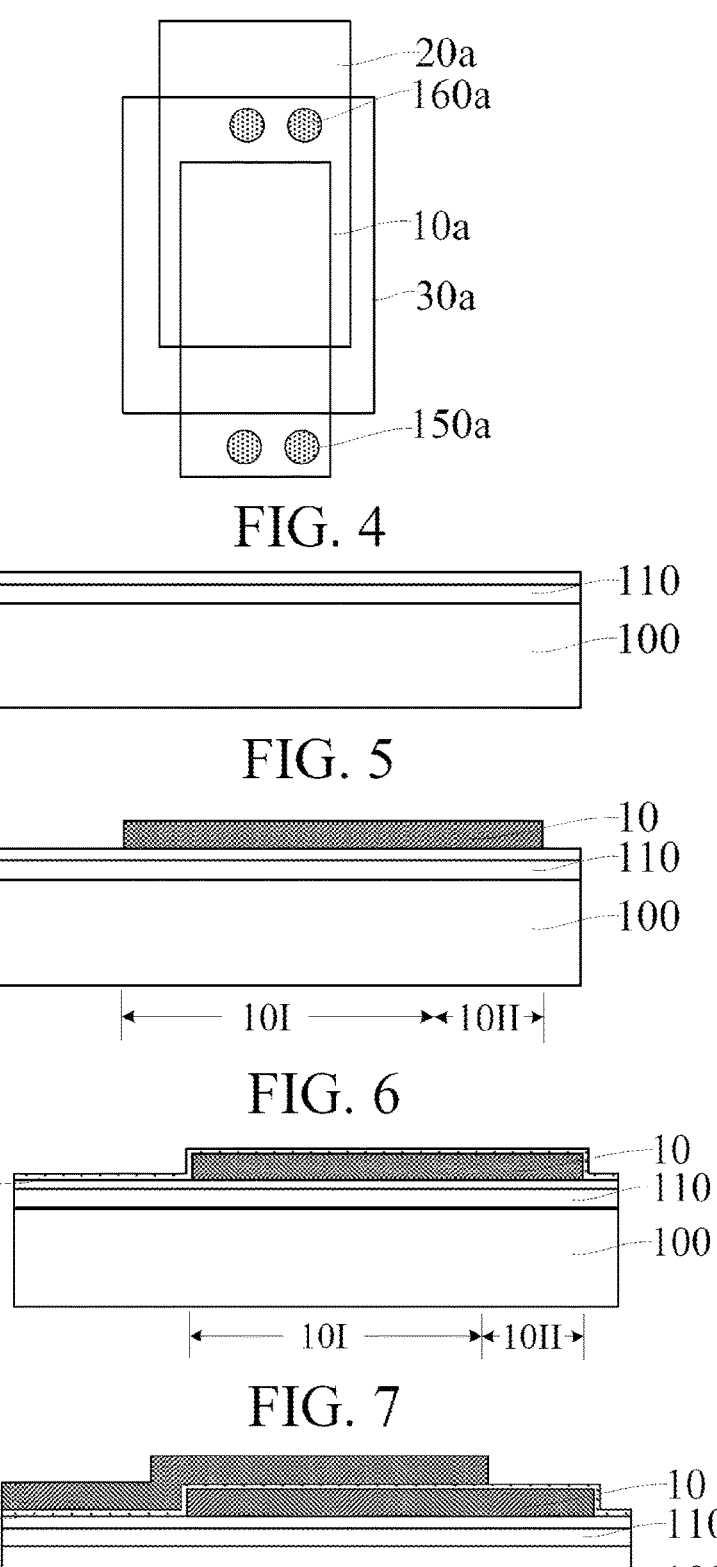
FIG. 5 to FIG. 11 are schematic structural diagrams corresponding to steps in one form of a method for forming a semiconductor structure according to the present disclosure.

FIG. 3 and FIG. 4 are schematic structural diagrams of another form of a semiconductor structure according to the present disclosure. FIG. 3 is a cross-sectional view, and FIG. 4 is a top view corresponding to FIG. 3. Similarities of this form to the above-described forms are not described in detail herein. A difference between this form and the above-described form lies in that:

In some implementations, a second electrically connecting structure set 220 is arranged in the semiconductor structure. The second electrically connecting structure set includes: a third electrically connecting structure 150a, in contact with a first electrode layer 10a; and a fourth electrically connecting structure 160a, in contact with a second electrode layer 20a and a third electrode layer 30a.

In some implementations, during operation of the MIM capacitor, the second electrode layer 20a and the third electrode layer 30a are connected to a same potential by the fourth electrically connecting structure 160a, and the first electrode layer 10a is connected to another potential by the third electrically connecting structure 150a, so that the second electrode layer 20a and the first electrode layer 10a in the first region 10I form an MIM capacitor, and the third electrode layer 30a and the first electrode layer 10a in the second region 10II form an MIM capacitor. In this way, different equivalent capacitance densities can be obtained, thereby satisfying demands of different types of capacitors.

The third electrically connecting structure 150a is configured to electrically connect the first electrode layer 10a to an external circuit.

The fourth electrically connecting structure 160a is configured to electrically connect the second electrode layer 20a to the third electrode layer 30a, and is further configured to electrically connect the second electrode layer 20a and the third electrode layer 30a to an external circuit.

Specifically, in some implementations, the first electrode layer 10a further includes a third region 10III for electrical connection, and the second electrode layer 20a includes a connection region 20I for electrical connection.

Correspondingly, the third electrode layer 30a covers the connection region 20I, and the third region 10III is exposed from the third electrode layer, which helps form, in the third region 10III, a third electrically connecting structure in contact with the first electrode layer 10a and form, in the connection region 20I, a fourth electrically connecting structure extending through the third electrode layer 30a and in contact with the second electrode layer 20a.

Correspondingly, in some implementations, the third electrically connecting structure 150a is arranged in the third region 10III and is in contact with the first electrode layer 10a, and the fourth electrically connecting structure 160a extends through the second dielectric layer and the third electrode layer 30a in the connection region 20I, and is in contact with the second electrode layer 20a, so that the fourth electrically connecting structure 160a electrically connects the second electrode layer 20a to the third electrode layer 30a.

For detailed description of the third electrically connecting structure 150a and the fourth electrically connecting structure 160a, refer to the corresponding description of the first electrically connecting structure and the second electrically connecting structure in the above forms. The details are not described herein.

It should be noted that, in other implementations, the semiconductor structure may further include: a fifth dielectric layer, arranged on the third electrode layer; and a fifth electrode layer, arranged on the fifth dielectric layer, where on the projection plane parallel to the base, the fifth electrode layer covers the third region.

The third electrically connecting structure extends through the fifth electrode layer in the third region and is in contact with the first electrode layer. Specifically, the third electrically connecting structure extends through the first electrode layer in the third region, and the fourth electrically connecting structure extends through the second electrode layer in the connection region.

Correspondingly, during operation of the MIM capacitor, the first electrode layer and the fifth electrode layer are connected to a same potential, and the second electrode layer and the third electrode layer are connected to a same potential, so that a capacitor is formed between the first electrode layer and the second electrode layer, a capacitor is formed between the first electrode layer and the third electrode layer, and a capacitor is formed between the third electrode layer and the fifth electrode layer, which can also increase a capacitance value per unit area.

Accordingly, the present disclosure further provides a method for forming a semiconductor structure. FIG. 5 to FIG. 11 are schematic structural diagrams corresponding to steps in one form of a method for forming a semiconductor structure according to the present disclosure.

The method for forming a semiconductor structure in this form is described in detail below with reference to the drawings.

Referring to FIG. 5, a base 100 is provided.

The base 100 is configured to provide a process platform for subsequent formation of an MIM capacitor.

In some implementations, the base 100 includes a substrate (not shown), and the substrate is a silicon substrate. In other implementations, the substrate may be made of other materials such as germanium, silicon germanium, silicon carbide, gallium arsenide, or indium gallium, and the substrate may be other types of substrates such as a silicon substrate on an insulator or a germanium substrate on an insulator.

In some implementations, the MIM capacitor is formed in a back-end process.

Therefore, an IMD layer (not shown) is further formed on the base 100. According to a status of the process, one or more stacked metal layers, such as a first metal (that is, M1) layer and a second metal (that is, M2) layer are formed in the inter-metal dielectric layer along a normal direction of a surface of the base. When a plurality of metal layers is arranged, two adjacent metal layers are electrically connected by a via interconnecting structure located therebetween.

Still referring to FIG. 5, an etching stop layer 110 is formed on the base 100.

The etching stop layer 110 is configured to define a position where the etching stops during subsequent formation of the first electrode layer, the first electrically connecting structure, and the second electrically connecting structure, or the first electrode layer, the third electrically connecting structure, and the fourth electrically connecting structure, so as to reduce a probability of causing damage to the base 100, which helps improve bottom height consistency of the first electrically connecting structure set and the second electrically connecting structure set and improve bottom height consistency of the third electrically connecting structure set and the fourth electrically connecting structure set.

In an example, a material of the etching stop layer 110 is silicon nitride. In other implementations, the etching stop layer may be made of other materials with a relatively high etch selectivity to a material of the base, such as one or more of silicon nitride, aluminum oxide, aluminum nitride, or carbon-doped silicon nitride.

Referring to FIG. 6, a first electrode layer 10 is formed on the base 100, and the first electrode layer 10 includes a first region 10I and a second region 10II.

The first electrode layer 10 is used as an electrode plate of the MIM capacitor. Specifically, the first electrode layer 10 is formed on the etching stop layer 110.

A material of the first electrode layer 10 is a conductive material. In an example, the material of the first electrode layer 10 includes one or more of W, Cu, Co, TiN, Ti, Ta, TaN, Ru, RuN, or AL.

In some implementations, the step of forming the first electrode layer 10 includes: forming a first electrode material layer (not shown) on the etching stop layer 110. The first electrode material layer is patterned to form the first electrode layer 10.

Specifically, the first electrode material layer is patterned using an etching process. During the patterning of the first electrode material layer, the etching stop layer 110 can define an etching stop position, thereby reducing a probability of causing damage to the base 100 in the process of patterning the first electrode material layer.

In some implementations, the first electrode layer 10 is formed using a sputtering process. The sputtering process has high process compatibility and low process costs.

Referring to FIG. 7, a first dielectric layer 120 is formed on a top and a sidewall of the first electrode layer 10.

The first dielectric layer 120 is used as an insulating layer in the formed MIM capacitor, to isolate the first electrode layer 10 from the subsequent second electrode layer. Specifically, the first dielectric layer 120 conformally covers the first electrode layer 10 and the base 100.

In some implementations, the material of the first dielectric layer 120 is a high-k dielectric material. The high-k dielectric material is a dielectric material having a relative dielectric constant greater than a relative dielectric constant of silicon oxide. Using the high-k dielectric material can help increase a capacitance value of the MIM capacitor, thereby improving a capacitance density.

Specifically, the first dielectric layer 120 is a high-k dielectric layer formed by stacking, that is, the first dielectric layer 120 is a high-k composite dielectric layer. After a thickness of the high-k dielectric layer reaches a set value, quality of the high-k dielectric layer tends to deteriorate. By using the high-k composite dielectric layer, the thickness of the first dielectric layer 120 can satisfy process requirements, and relative desirable quality can be realized. The high-k dielectric material includes any one or more of $HfO_2$, $HfSiO$, $TiO_2$, $HfZrO$, $HfSiON$, $HfTaO$, $HfTiO$, $Ta_2O_5$, $ZrO_2$, $ZrSiO_2$, $Al_2O_3$, $SrTiO_3$, $BaSrTiO$, or $SiN$.

In some implementations, the first dielectric layer 120 is a ZAZ layer. The ZAZ layer includes a first $ZrO_2$ layer, an $Al_2O_3$ layer, and a second $ZrO_2$ layer formed by stacking.

In other implementations, according to process requirements, the material of the first dielectric layer may be one or more of silicon oxide, silicon oxynitride, or silicon nitride.

In some implementations, the first dielectric layer 120 is formed using a chemical vapor deposition process which has high process compatibility and helps reduce process costs. In other implementations, based on actual process requirements, the first dielectric layer by using other suitable deposition processes, such as an atomic layer deposition process.

Referring to FIG. 8, a second electrode layer 20 is formed on the first dielectric layer 120. The second electrode layer 20 covers the first dielectric layer 120 in the first region 10I.

The second electrode layer 20 is used as an electrode plate of the MIM capacitor.

The second electrode layer 20 covers the first dielectric layer 120 in the first region 10I, so that the second electrode layer 20 is arranged opposite to the first region 10I. Therefore, the second electrode layer 20 can form an MIM capacitor with the first electrode layer 10 in the first region 10I.

In some implementations, the second region 10II is exposed from the second electrode layer 20, so that a subsequently formed third electrode layer can cover the second region 10II, which helps subsequently form the second electrically connecting structure extending through the third electrode layer in the second region 10II, and the second electrically connecting structure can come into contact with the first electrode layer 10, thereby realizing electrical connection between the first electrode layer 10 and the third electrode layer.

It should be noted that, in some implementations, in the step of forming the second electrode layer 20, the second electrode layer 20 includes a connection region 20I for electrical connection. In some implementations, the connection region 20I is arranged on a side of the first electrode layer 10. The connection region 20I is configured to subsequently form an electrically connecting structure for electrically connecting the second electrode layer 20 to the outside.

A material of the second electrode layer 20 is a conductive material. In an example, the material of the first electrode layer 20 includes one or more of W, Cu, Co, TiN, Ti, Ta, TaN, Ru, RuN, or AL.

In some implementations, the step of forming the second electrode layer 20 includes: conformally covering the first dielectric layer 120 with a second electrode material layer (not shown); and removing the second electrode material layer in the second region 10II and a part of the second electrode material layer on the first dielectric layer 120 on the base 100, where a remaining second electrode material layer is used as the second electrode layer 20.

In an example, the second electrode material layer is formed by using a sputtering process.

Figure 9:
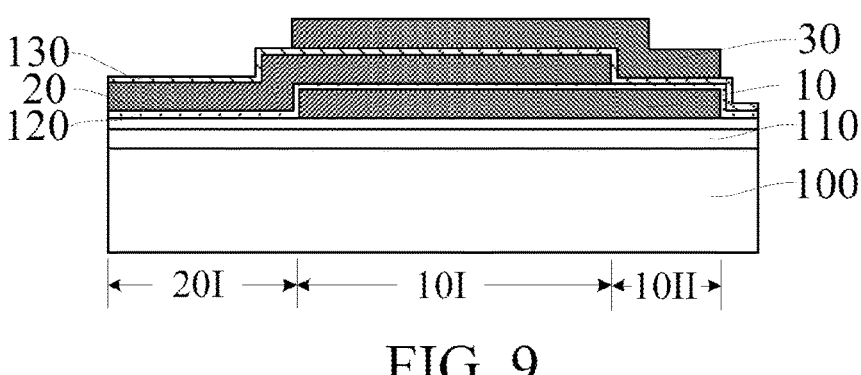

Referring to FIG. 9, a second dielectric layer 130 is formed on the second electrode layer 20 and in the second region 10II.

The second dielectric layer 130 is used as an insulating layer of the MIM capacitor, to isolate the second electrode layer 20 from the subsequently formed third electrode layer.

In some implementations, the second dielectric layer 130 conformally covers the second electrode layer 20 and the second region 10II.

In some implementations, the material of the second dielectric layer 130 is a high-k dielectric material. The high-k dielectric material is a dielectric material having a relative dielectric constant greater than a relative dielectric constant of silicon oxide. Using the high-k dielectric material can help increase a capacitance value of the MIM capacitor, thereby improving a capacitance density.

Specifically, the second dielectric layer 130 is a high-k dielectric layer formed by stacking, that is, the second dielectric layer 130 is a high-k composite dielectric layer. After a thickness of the high-k dielectric layer reaches a set value, quality of the high-k dielectric layer tends to deteriorate. By using the high-k composite dielectric layer, the thickness of the second dielectric layer 130 can satisfy process requirements, and relative desirable quality can be realized.

The high-k dielectric layer material includes any one or more of $HfO_2$, HfSiO, $TiO_2$, HfZrO, HfSiON, HfTaO, HfTiO, $Ta_2O_5$, $ZrO_2$, $ZrSiO_2$, $Al_2O_3$, $SrTiO_3$, BaSrTiO, or SiN.

The material of the second dielectric layer 130 may be the same as or different from the material of the first dielectric layer 120.

In some implementations, the second dielectric layer 130 is a ZAZ layer. The ZAZ layer includes a first $ZrO_2$ layer, an $Al_2O_3$ layer, and a second $ZrO_2$ layer formed by stacking. In other implementations, according to process requirements, the material of the second dielectric layer may be one or more of silicon oxide, silicon oxynitride, or silicon nitride.

In some implementations, the second dielectric layer 130 is formed by using a chemical vapor deposition process which has high process compatibility and helps reduce process costs. In other implementations, based on actual process requirements, the second dielectric layer by using other suitable deposition processes, such as an atomic layer deposition process.

Still referring to FIG. 9, a third electrode layer 30 is formed on the second dielectric layer 130. On the projection plane parallel to the base 100, the third electrode layer 30 has an overlapping region with each of the first region 10I and the second region 10II.

The third electrode layer 30 is used as an electrode plate of the MIM capacitor.

On the projection plane parallel to the base 100, the third electrode layer 30 has an overlapping region with each of the first region 10I and the second region 10II. That is to say, the third electrode layer 30 is arranged opposite to the second electrode layer 20 and the first electrode layer 10, which helps subsequently form the first electrically connecting structure in contact with the second electrode layer and form, in the second region, the second electrically connecting structure in contact with the third electrode layer and the first electrode layer, or helps form the third electrically connecting structure in contact with the first electrode layer and form the fourth electrically connecting structure in contact with the second electrode layer and the third electrode layer.

The third electrode layer 30 and the second region 10II have an overlapping region, which helps subsequently form, in the second region 100II, the second electrically connecting structure extending through the third electrode layer 30 and in contact with the first electrode layer 10, thereby realizing electrical connection between the third electrode layer 30 and the first electrode layer 10.

It should be noted that, in the step of forming the third electrode layer 30, the connection region 20I is exposed from the third electrode layer 30, which helps subsequently form, in the connection region 20I, the third electrically connecting structure in contact with the second electrode layer 20, thereby realizing electrical connection between the second electrode layer and the external circuit.

A material of the third electrode layer 30 is a conductive material. In an example, the material of the third electrode layer 30 includes one or more of W, Cu, Co, TiN, Ti, Ta, TaN, Ru, RuN, or AL.

In some implementations, the step of forming the third electrode layer 30 includes: conformally covering the second dielectric layer 130 with a third electrode material layer (not shown); and removing the third electrode material layer in the connection region 20I, where a remaining third electrode material layer is used as the third electrode layer 30.

In an example, the third electrode material layer is formed using a sputtering process.

Figure 10:
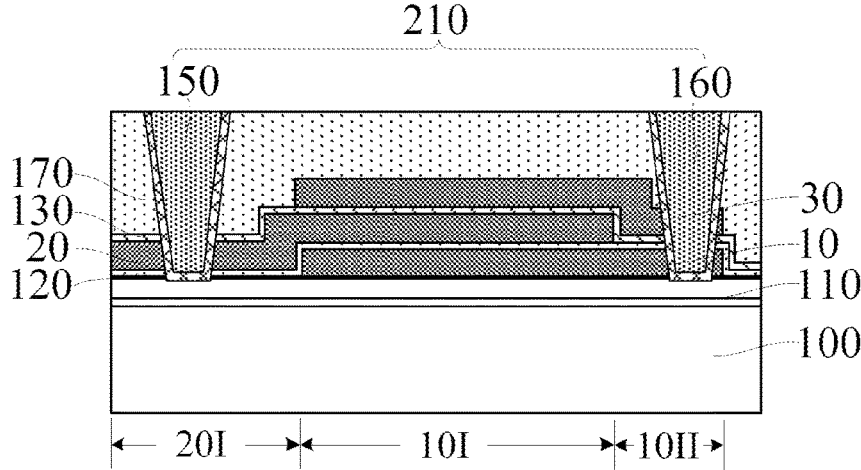
Figure 11:
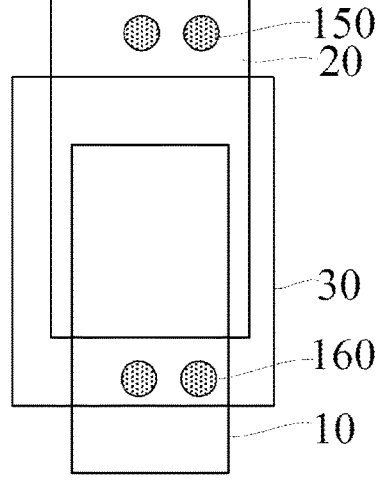

Referring to FIG. 10 and FIG. 11, FIG. 10 is a cross-sectional view, and FIG. 11 is a top view corresponding to FIG. 10. In some implementations, after forming the third electrode layer 30, the forming a semiconductor structure further includes: forming a first electrically connecting structure 150 in contact with the second electrode layer 20 and forming, in the second region 10II, a second electrically connecting structure 160 in contact with the third electrode layer 30 and the first electrode layer 10; or forming a third electrically connecting structure in contact with the first electrode layer and forming a fourth electrically connecting structure in contact with the second electrode layer and the third electrode layer.

Since the first electrically connecting structure 150 in contact with the second electrode layer 20 is formed, and the second electrically connecting structure 160 in contact with the third electrode layer 30 and the first electrode layer 10 is formed in the second region 10II, a capacitor is formed between the first electrode layer 10 and the second electrode layer 20 and between the second electrode layer 20 and the third electrode layer 30, which helps improve the equivalent capacitance density. Alternatively, since the third electrically connecting structure in contact with first electrode layer is formed, and the fourth electrically connecting structure in contact with the second electrode layer and the third electrode layer is formed, a capacitor is formed between the first electrode layer and the second electrode layer and between the first electrode layer and the third electrode layer. Therefore, embodiments and implementations of the present disclosure help provide options for obtaining different equivalent capacitance densities to satisfy demands of different types of capacitors.

In some implementations, for example, the first electrically connecting structure 150 and the second electrically connecting structure 160 are arranged so that a capacitor is formed between the first electrode layer 10 and the second electrode layer 20 and between the second electrode layer 20 and the third electrode layer 30, which helps improve the equivalent capacitance density.

Therefore, in some implementations, since a capacitor is formed between the first electrode layer 10 and the second electrode layer 20 and between the second electrode layer 20 and the third electrode layer 30, and the first electrode layer 10 and the third electrode layer 30 are connected to a same potential by the second electrically connecting structure 160, so that the two formed capacitors are connected in parallel, thereby increasing a capacitance value per unit area, that is, increasing the equivalent capacitance density.

The first electrically connecting structure 150 is configured to electrically connect the second electrode layer 20 to an external circuit.

A material of the first electrically connecting structure 150 is a conductive material, which includes one or more of W, Cu, Co, TiN, Ti, Ta, TaN, Ru, RuN, or AL.

In some implementations, the step of forming first electrically connecting structure 150 includes: forming, in connection region 20I, a first electrically connecting structure 150 in contact with the second electrode layer 20.

In some implementations, the second electrode layer 20 in the connection region 20I covers the first dielectric layer 120 on the base 100. Since the first electrically connecting structure 150 extends through the second electrode layer 20 in the connection region 20I, and a bottom of the first electrically connecting structure 150 is in contact with a top surface of the etching stop layer 110, the bottom of the first electrically connecting structure 150 can stop on the etching stop layer 110, which helps improve the bottom height consistency of the first electrically connecting structure 150.

The second electrically connecting structure 160 is configured to electrically connect the first electrode layer 10 to the third electrode layer 30, and is further configured to electrically connect the first electrode layer 10 and the third electrode layer 30 to the external circuit. Therefore, when the capacitor works, the first electrode layer 10 and the third electrode layer 30 can be connected to the same potential.

A material of the second electrically connecting structure 160 is a conductive material, which includes one or more of W, Cu, Co, TiN, Ti, Ta, TaN, Ru, RuN, or AL.

In some implementations, the step of forming the second electrically connecting structure 160 includes: forming a second electrically connecting structure 160 extending through the first dielectric layer 120, the second dielectric layer 130, and the third electrode layer 30 in the second region 10II and in contact with the first electrode layer 10, so that the second electrically connecting structure 160 electrically connects the first electrode layer 10 to the third electrode layer 30.

In some implementations, the second electrically connecting structure 160 extends through the first electrode layer 10, and a bottom of the second electrically connecting structure 160 is in contact with the top surface of the etching stop layer 110, thereby improving the bottom height consistency of the second electrically connecting structure 160.

In some implementations, the first electrically connecting structure 150 and the second electrically connecting structure 160 constitute the first electrically connecting structure set 210.

It should be noted that, in some implementations, before forming the first electrically connecting structure 150 and the second electrically connecting structure 160, the method for forming a semiconductor structure further includes: forming a dielectric layer 170 on the base 100.

The dielectric layer 170 is configured to isolate the electrically connecting structures. A material of the dielectric layer 170 is a dielectric material. In an example, the material of the dielectric layer 170 is silicon oxide.

Correspondingly, in some implementations, the step of forming the first electrically connecting structure 150 and the second electrically connecting structure 160 includes: forming a first conductive via (not shown) extending through the second electrode layer 20 and the dielectric layer 170 in the connection region 20I; and forming a second conductive via (not shown) extending through the first electrode layer 10 and the third electrode layer 30 in the second region 10II. The first conductive via and the second conductive via are filled to form the first electrically connecting structure 150 in the first conductive via and the second electrically connecting structure 160 in the second conductive via.

In some implementations, the first conductive via and the second conductive via is formed using an etching process and the top surface of the etching stop layer 110 as the etching stop position, which correspondingly reduce a probability of causing damage to the base 100 during the etching process for forming the first conductive via and the second conductive via is reduced, and improves bottom height consistency of the first conductive via and the second conductive via.

It should be further noted that, in some implementations, three electrode layers that are stacked are formed, for example.

In other implementations, another electrode layer may be further stacked after the third electrode layer is formed.

For example, in other implementations, after forming the third electrode layer and before forming the first electrically connecting structure and the second electrically connecting structure, the method for forming a semiconductor structure further includes: forming one or more fourth electrode layers on the third electrode layer, and forming a fourth dielectric layer between adjacent fourth electrode layers and between the fourth electrode layers and the third electrode layer, where on the projection plane parallel to the base, an odd-numbered fourth electrode layer covers the first region and the connection region and the second region is exposed from the odd-numbered fourth electrode layer, and an even-numbered fourth electrode layer has an overlapping region with each of the first region and the second region.

In the step of forming the first electrically connecting structure, the first electrically connecting structure extends through the odd-numbered fourth electrode layer in the connection region, and is in contact with the second electrode layer, so that the first electrically connecting structure electrically connects the second electrode layer to the odd-numbered fourth electrode layer.

In the step of forming the second electrically connecting structure, the second electrically connecting structure extends through the even-numbered fourth electrode layer in the second region, and is in contact with the first electrode layer, so that the second electrically connecting structure electrically connects the first electrode layer to the even-numbered fourth electrode layer.

Correspondingly, an MIM capacitor is formed between each two adjacent electrode layers, and the plurality of MIM capacitors are connected in parallel, which helps further improve the equivalent capacitance density.

It should be noted that, in some implementations, the odd-numbered layer and the even-numbered layer are numbers of layers corresponding to the fourth electrode layers along a direction from the base to the first electrode layer. For example, a fourth electrode layer closest to the third electrode layer is a first fourth electrode layer, and a fourth electrode layer adjacent to the first layer electrode layer is a second fourth electrode layer. Correspondingly, the first fourth electrode layer is an odd-numbered fourth electrode layer, and the second fourth electrode layer is an even-numbered electrode layer, and so on.

In some implementations, the second electrode layer in the connection region covers the first electrode layer on the base, the first electrically connecting structure extends through the second electrode layer in the connection region, and the second electrically connecting structure extends through the first electrode layer in the second region.

Figure 12:
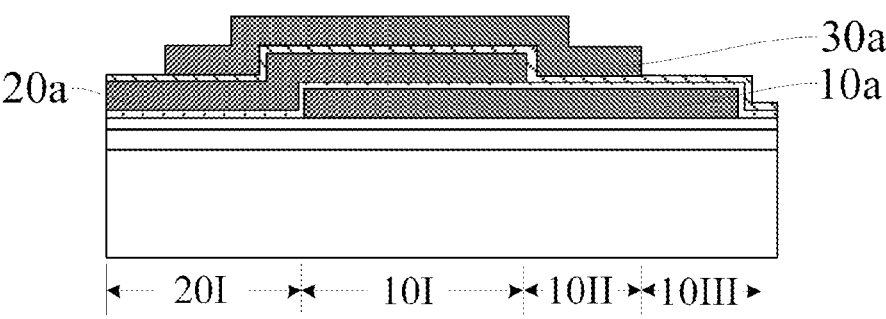
FIG. 12 to FIG. 14 are schematic structural diagrams corresponding to steps in another form of a method for forming a semiconductor structure according to the present disclosure.
Figure 13:
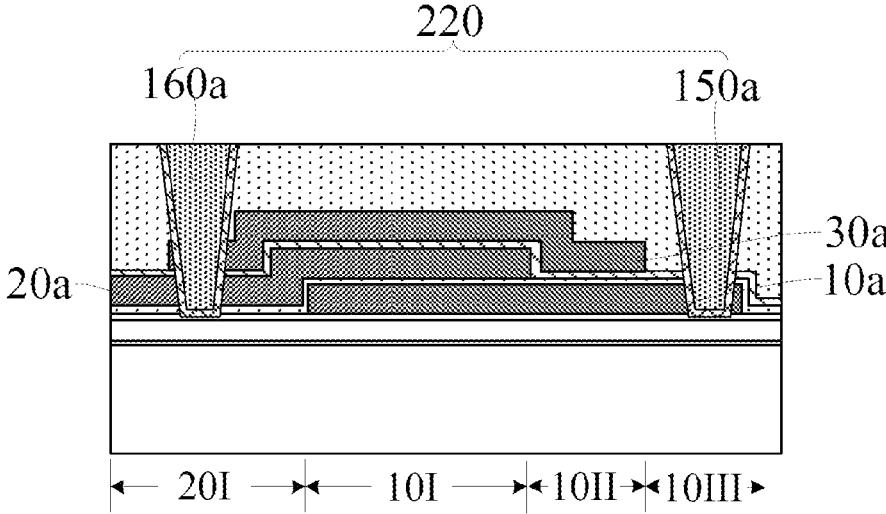
Figure 14:
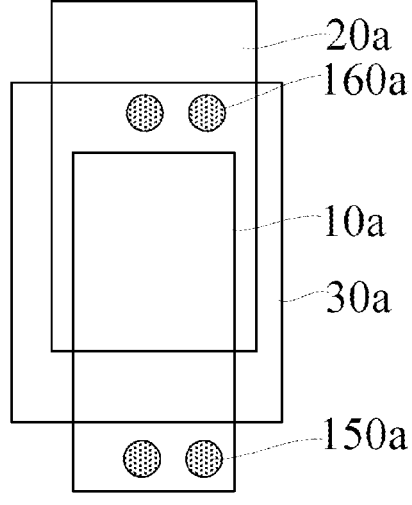

FIG. 12 to FIG. 14 are schematic structural diagrams corresponding to steps in another form of a method for forming a semiconductor structure according to the present disclosure. Similarities of this form to the above-described form are not described in detail herein. A difference between this form and the above-described form lies in that:

Referring to FIG. 12, in the step of forming the first electrode layer 10*a*, the first electrode layer 10*a* further includes a third region 10III for electrical connection. In the step of forming the second electrode layer 20*a*, the second electrode layer 20*a* includes a connection region 20I for electrical connection.

Still referring to FIG. 12, in the step of forming the third electrode layer 30*a*, the third electrode layer 30*a* covers the connection region 20I, and the third region 10III is exposed from the third electrode layer, which helps subsequently form, in the third region 10III, a third electrically connecting structure in contact with the first electrode layer 10*a* and form, in the connection region 20I, a fourth electrically connecting structure extending through the third electrode layer 30*a* and in contact with the second electrode layer 20*a*.

Referring to FIG. 13 to FIG. 14, FIG. 13 is a cross-sectional view, and FIG. 14 is a top view corresponding to FIG. 13. A third electrically connecting structure in contact with the first electrode layer is formed, and a fourth electrically connecting structure in contact with the second electrode layer and the third electrode layer is formed.

In some implementations, during operation of the MIM capacitor, the second electrode layer 20*a* and the third electrode layer 30*a* are connected to a same potential by the fourth electrically connecting structure 160*a*, and the first electrode layer 10*a* is connected to another potential by the third electrically connecting structure 150*a*, so that the second electrode layer 20*a* and the first electrode layer 10*a* in the first region 10I form an MIM capacitor, and the third electrode layer 30*a* and the first electrode layer 10*a* in the second region 10II form an MIM capacitor. In this way, different equivalent capacitance densities can be obtained, thereby satisfying demands of different types of capacitors.

The third electrically connecting structure 150*a* is configured to electrically connect the first electrode layer 10*a* to an external circuit.

In some implementations, the step of forming the third electrically connecting structure 150*a* includes: forming, in the third region 10III, a first electrically connecting structure 150*a* in contact with the first electrode layer 10*a*.

The fourth electrically connecting structure 160*a* is configured to electrically connect the second electrode layer 20*a* to the third electrode layer 30*a*, and is further configured to electrically connect the second electrode layer 20*a* and the third electrode layer 30*a* to an external circuit.

In some implementations, the step of forming the fourth electrically connecting structure 160*a* includes: forming, in the connection region 20I, a fourth electrically connecting structure 160*a* extending through the second dielectric layer and the third electrode layer 30*a* and in contact with the second electrode layer 20*a*, so that the fourth electrically connecting structure 160*a* electrically connects the second electrode layer 20*a* to the third electrode layer 30*a*.

For detailed description of materials and formation steps of the third electrically connecting structure 150*a* and the fourth electrically connecting structure 160*a*, refer to the corresponding description of the first electrically connecting structure and the second electrically connecting structure in the above embodiments. The details are not described herein.

It should be noted that, in other implementations, the method for forming a semiconductor structure further includes: forming a fifth dielectric layer on the third electrode layer after forming the third electrode layer and before forming the third electrically connecting structure and the fourth electrically connecting structure; and forming a fifth electrode layer on the fifth dielectric layer, where on the projection plane parallel to the base, the fifth electrode layer covers the third region.

In the step of forming the third electrically connecting structure, the third electrically connecting structure extends through the fifth electrode layer in the third region and is in contact with the first electrode layer.

Specifically, the third electrically connecting structure extends through the first electrode layer in the third region, and the fourth electrically connecting structure extends through the second electrode layer in the connection region.

Correspondingly, during operation of the MIM capacitor, the first electrode layer and the fifth electrode layer are connected to a same potential, and the second electrode layer and the third electrode layer are connected to a same potential, so that a capacitor is formed between the first electrode layer and the second electrode layer, a capacitor is formed between the first electrode layer and the third electrode layer, and a capacitor is formed between the third electrode layer and the fifth electrode layer, which can also increase a capacitance value per unit area.

Although the present disclosure is disclosed above, the present disclosure is not limited thereto. A person skilled in the art can make various changes and modifications without departing from the spirit and the scope of the present disclosure. Therefore, the protection scope of the present disclosure should be subject to the scope defined by the claims.

What is claimed is:

1. A semiconductor structure, comprising:

a base;

a first electrode layer, arranged on the base and comprising a first region and a second region;

a first dielectric layer, arranged on a top and a sidewall of the first electrode layer;

a second electrode layer, covering the first dielectric layer in the first region;

a second dielectric layer, arranged on the second electrode layer and the second region;

a third electrode layer, arranged on the second dielectric layer, wherein on a projection plane parallel to the base, the third electrode layer has an overlapping region with each of the first region and the second region; and a second electrically connecting structure set, comprising:

a third electrically connecting structure, in contact with the first electrode layer; and a fourth electrically connecting structure, in contact with the second electrode layer and the third electrode layer;

wherein the first electrode layer further comprises a third region for electrical connection, the second electrode layer comprises a connection region for electrical connection, and the third electrode layer covers the connection region and the third region is exposed from the third electrode layer; and the third electrically connecting structure is arranged in the third region and is in contact with the first electrode layer, and the fourth electrically connecting structure extends through the second dielectric layer and the third electrode layer in the connection region, and is in contact with the second electrode layer, so that the fourth electrically connecting structure electrically connects the second electrode layer to the third electrode layer.

2. The semiconductor structure according to claim 1, further comprising:

a first electrically connecting structure set, comprising:

a first electrically connecting structure, in contact with the second electrode layer; and a second electrically connecting structure, arranged in the second region and in contact with the third electrode layer and the first electrode layer, wherein:

the second region is exposed from the second electrode layer, the second electrode layer comprises a connection region for electrical connection, and the connection region is exposed from the third electrode layer;

the first electrically connecting structure is arranged in the connection region and in contact with the second electrode layer; and the second electrically connecting structure extends through the first dielectric layer, the second dielectric layer, and the third electrode layer in the second region, and is in contact with the first electrode layer, so that the second electrically connecting structure electrically connects the first electrode layer to the third electrode layer.

3. The semiconductor structure according to claim 2, further comprising:

one or more fourth electrode layers, arranged on the third electrode layer, wherein on the projection plane parallel to the base, an odd-numbered fourth electrode layer covers the first region and the connection region and the second region is exposed from the odd-numbered fourth electrode layer, and an even-numbered fourth electrode layer has an overlapping region with each of the first region and the second region; and a fourth dielectric layer, arranged between the fourth electrode layer and the third electrode layer and between adjacent fourth electrode layers;

wherein the first electrically connecting structure extends through the odd-numbered fourth electrode layer in the connection region, and is in contact with the second electrode layer, so that the first electrically connecting structure electrically connects the second electrode layer to the odd-numbered fourth electrode layer; and wherein the second electrically connecting structure extends through the even-numbered fourth electrode layer in the second region, and is in contact with the first electrode layer, so that the second electrically connecting structure electrically connects the first electrode layer to the even-numbered fourth electrode layer.

4. The semiconductor structure according to claim 2, wherein:

the second electrode layer in the connection region covers the first dielectric layer on the base, the first electrically connecting structure extends through the second electrode layer in the connection region, and the second electrically connecting structure extends through the first electrode layer in the second region.

5. The semiconductor structure according to claim 1, further comprising:

a fifth dielectric layer, arranged on the third electrode layer; and a fifth electrode layer, arranged on the fifth dielectric layer, wherein on the projection plane parallel to the base, the fifth electrode layer covers the third region; and wherein the third electrically connecting structure extends through the fifth electrode layer in the third region and is in contact with the first electrode layer.

6. The semiconductor structure according to claim 1, wherein the third electrically connecting structure extends through the first electrode layer in the third region, and the

19 fourth electrically connecting structure extends through the second electrode layer in the connection region.

7. The semiconductor structure according to claim 1, further comprising an etching stop layer arranged between the base and the first electrode layer and between the base and the first dielectric layer.

8. The semiconductor structure according to claim 1, wherein:

a material of the first dielectric layer comprises at least one of HfO2, HfSiO, TiO2, HfZrO, HfSiON, HfTaO, HfTiO, Ta2O5, ZrO2, ZrSiO2, Al2O3, SrTiO3, BaSr-TiO, or SiN;

a material of the second dielectric layer comprises at least one of HfO2, HfSiO, TiO2, HfZrO, HfSiON, HfTaO, HfTiO, Ta2O5, ZrO2, ZrSiO2, Al2O3, SrTiO3, BaSr-TiO, or SiN;

a material of the first electrode layer comprises at least one of W, Cu, Co, TiN, Ti, Ta, TaN, Ru, RuN, or AL;

a material of the second electrode layer comprises at least one of W, Cu, Co, TiN, Ti, Ta, TaN, Ru, RuN, or AL; and a material of the third electrode layer comprises at least one of W, Cu, Co, TiN, Ti, Ta, TaN, Ru, RuN, or AL.

9. The semiconductor structure according to claim 2, wherein:

a material of the first electrically connecting structure comprises at least one of W, Cu, Co, TiN, Ti, Ta, TaN, Ru, RuN, or Al;

a material of the second electrically connecting structure comprises at least one of W, Cu, Co, TiN, Ti, Ta, TaN, Ru, RuN, or Al;

a material of the third electrically connecting structure comprises at least one of W, Cu, Co, TiN, Ti, Ta, TaN, Ru, RuN, or Al; and a material of the fourth electrically connecting structure comprises at least one of W, Cu, Co, TiN, Ti, Ta, TaN, Ru, RuN, or Al.

10. A method for forming a semiconductor structure, comprising:

providing a base;

forming a first electrode layer on the base, wherein the first electrode layer comprises a first region and a second region;

forming a first dielectric layer on a top and a sidewall of the first electrode layer;

forming a second electrode layer on the first dielectric layer, wherein the second electrode layer covers the first dielectric layer in the first region;

forming a second dielectric layer on the second electrode layer and in the second region;

forming a third electrode layer on the second dielectric layer, wherein on a projection plane parallel to the base, the third electrode layer has an overlapping region with each of the first region and the second region; and forming a first electrically connecting structure in contact with the second electrode layer, and forming, in the second region, a second electrically connecting structure in contact with the third electrode layer and the first electrode layer; or forming a third electrically connecting structure in contact with the first electrode layer, and forming a fourth electrically connecting structure in contact with the second electrode layer and the third electrode layer;

wherein in the step of forming the first electrode layer, the first electrode layer further comprises a third region for electrical connection, the second electrode layer comprises a connection region for electrical connection;

in the step of forming the third electrode layer, the third electrode layer covers the connection region and the third region is exposed from the third electrode layer;

the step of forming the third electrically connecting structure comprises: forming, in the third region, a third electrically connecting structure in contact with the first electrode layer; and the step of forming the fourth electrically connecting structure comprises: forming, in the connection region, a fourth electrically connecting structure extending through the second dielectric layer and the third electrode layer and in contact with the second electrode layer, so that the fourth electrically connecting structure electrically connects the second electrode layer to the third electrode layer.

11. The method for forming a semiconductor structure according to claim 10, further comprising:

forming a first electrically connecting structure in contact with the second electrode layer, and forming, in the second region, a second electrically connecting structure in contact with the third electrode layer and the first electrode layer, wherein:

in the step of forming the second electrode layer, the second region is exposed from the second electrode layer, and the second electrode layer comprises a connection region for electrical connection, and in the step of forming the third electrode layer, the connection region is exposed from the third electrode layer;

the step of forming the first electrically connecting structure comprises: forming, in the connection region, a first electrically connecting structure in contact with the second electrode layer; and the step of forming the second electrically connecting structure comprises: forming a second electrically connecting structure extending through the first dielectric layer, the second dielectric layer, and the third electrode layer in the second region and in contact with the first electrode layer, so that the second electrically connecting structure electrically connects the first electrode layer to the third electrode layer.

12. The method for forming a semiconductor structure according to claim 11, wherein:

after forming the third electrode layer and before forming the first electrically connecting structure and the second electrically connecting structure, the method for forming a semiconductor structure further comprises:

forming one or more fourth electrode layers on the third electrode layer, and forming a fourth dielectric layer between adjacent fourth electrode layers and between the fourth electrode layers and the third electrode layer, wherein on the projection plane parallel to the base, an odd-numbered fourth electrode layer covers the first region and the connection region and the second region is exposed from the odd-numbered fourth electrode layer, and an even-numbered fourth electrode layer has an overlapping region with each of the first region and the second region;

in the step of forming the first electrically connecting structure, the first electrically connecting structure extends through the odd-numbered fourth electrode layer in the connection region, and is in contact with the second electrode layer, so that the first electrically connecting structure electrically connects the second electrode layer to the odd-numbered fourth electrode layer; and in the step of forming the second electrically connecting structure, the second electrically connecting structure extends through the even-numbered fourth electrode layer in the second region, and is in contact with the first electrode layer, so that the second electrically connecting structure electrically connects the first electrode layer to the even-numbered fourth electrode layer.

13. The method for forming a semiconductor structure according to claim 11, wherein the second electrode layer in the connection region covers the first dielectric layer on the base, the first electrically connecting structure extends through the second electrode layer in the connection region, and the second electrically connecting structure extends through the first electrode layer.

14. The method for forming a semiconductor structure according to claim 10, further comprising:

forming a fifth dielectric layer on the third electrode layer after forming the third electrode layer and before forming the third electrically connecting structure and the fourth electrically connecting structure, and forming a fifth electrode layer on the fifth dielectric layer, wherein on the projection plane parallel to the base, the fifth electrode layer covers the third region; and wherein in the step of forming the third electrically connecting structure, the third electrically connecting structure extends through the fifth electrode layer in the third region and is in contact with the first electrode layer.

15. The method for forming a semiconductor structure according to claim 10, wherein the third electrically connecting structure extends through the first electrode layer in the third region, and the fourth electrically connecting structure extends through the second electrode layer the connection region.

16. The method for forming a semiconductor structure according to claim 10, further comprising: forming an etching stop layer on the base after providing the base and before forming the first electrode layer.

* * * * *